US008508226B2

(12) United States Patent
Feiweier et al.

(10) Patent No.: US 8,508,226 B2
(45) Date of Patent: Aug. 13, 2013

(54) METHOD AND MAGNETIC RESONANCE SYSTEM TO REDUCE DISTORTIONS IN DIFFUSION IMAGING

(75) Inventors: Thorsten Feiweier, Poxdorf (DE); Stefan Huwer, Erlangen (DE); Tony Hyun Kim, Cambridge, MA (US); David Andrew Porter, Poxdorf (DE); Thorsten Speckner, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 303 days.

(21) Appl. No.: 13/020,302

(22) Filed: Feb. 3, 2011

(65) Prior Publication Data
US 2011/0187367 A1 Aug. 4, 2011

(30) Foreign Application Priority Data

Feb. 4, 2010 (DE) .......................... 10 2010 001 577

(51) Int. Cl.
G01V 3/00 (2006.01)
(52) U.S. Cl.
USPC .......................................................... 324/309
(58) Field of Classification Search
USPC .................... 324/300–322; 600/410–435
See application file for complete search history.

(56) References Cited

U.S. PATENT DOCUMENTS

| 6,288,540 | B1 * | 9/2001 | Chen et al. ..................... 324/300 |
| 6,642,716 | B1 * | 11/2003 | Hoogenraad et al. ......... 324/309 |
| 2007/0223832 | A1 | 9/2007 | Matsumoto |
| 2010/0171498 | A1 | 7/2010 | Auslender et al. |
| 2011/0052031 | A1 | 3/2011 | Feiweier et al. |
| 2011/0085722 | A1 | 4/2011 | Feiweier |
| 2011/0241679 | A1 * | 10/2011 | Feiweier et al. ............... 324/309 |
| 2013/0033262 | A1 * | 2/2013 | Porter ........................... 324/309 |

OTHER PUBLICATIONS

U.S. Appl. No. 13/020,302, filed Feb. 4, 2011.
"Correction for Distortion of Echo-Planar Images Used to Calculate the Apparent Diffusion Coefficient," Haselgrove et al., Magnetic Resonance in Medicine, vol. 36 (1996) pp. 960-964.
"Eddy Current Correction in Diffusion-Weighted Imaging Using Pairs of Images Acquired With Opposite Diffusion Gradient Polarity," Bodammer et al., Magnetic Resonance in Medicine, vol. 51 (2004) pp. 188-193.
"Mutual Information," Latham et al., Scholarpedia (2008).
"Correction of Eddy-Current Distortions in Diffusion Tensor Images Using the Known Directions and Strengths of Diffusion Gradients," Zhuang, et al., Journal of Magnetic Resonance Imaging, vol. 24 (2006) pp. 1188-1199.
"Comprehensive Approach for Correction of Motion and Distortion in Diffusion-Weighted MRI," Rohde et al., Magnetic Resonance in Medicine, vol. 51 (2004) pp. 103-114.

* cited by examiner

Primary Examiner — Dixomara Vargas
(74) Attorney, Agent, or Firm — Schiff Hardin LLP

(57) ABSTRACT

In a method and magnetic resonance apparatus to reduce distortions in magnetic resonance diffusion imaging, a magnetic resonance data acquisition system is operated to acquire magnetic resonance data in a first measurement with a first diffusion weighting, and to acquire magnetic resonance data in a second measurement with a second, different diffusion weighting. A non-linear, system-specific distortion-correcting function is determined on the basis of system-specific information that is specific to said magnetic resonance data acquisition system. Correction parameters are calculated to correct distortions in subsequently-acquired diffusion-weighted magnetic resonance images, based on the data acquired in the first and second measurements with the system-specific distortion-correcting function applied thereto. The subsequently-acquired diffusion-weighted magnetic resonance images are corrected using the correction parameters to at least reduce distortions therein.

15 Claims, 8 Drawing Sheets

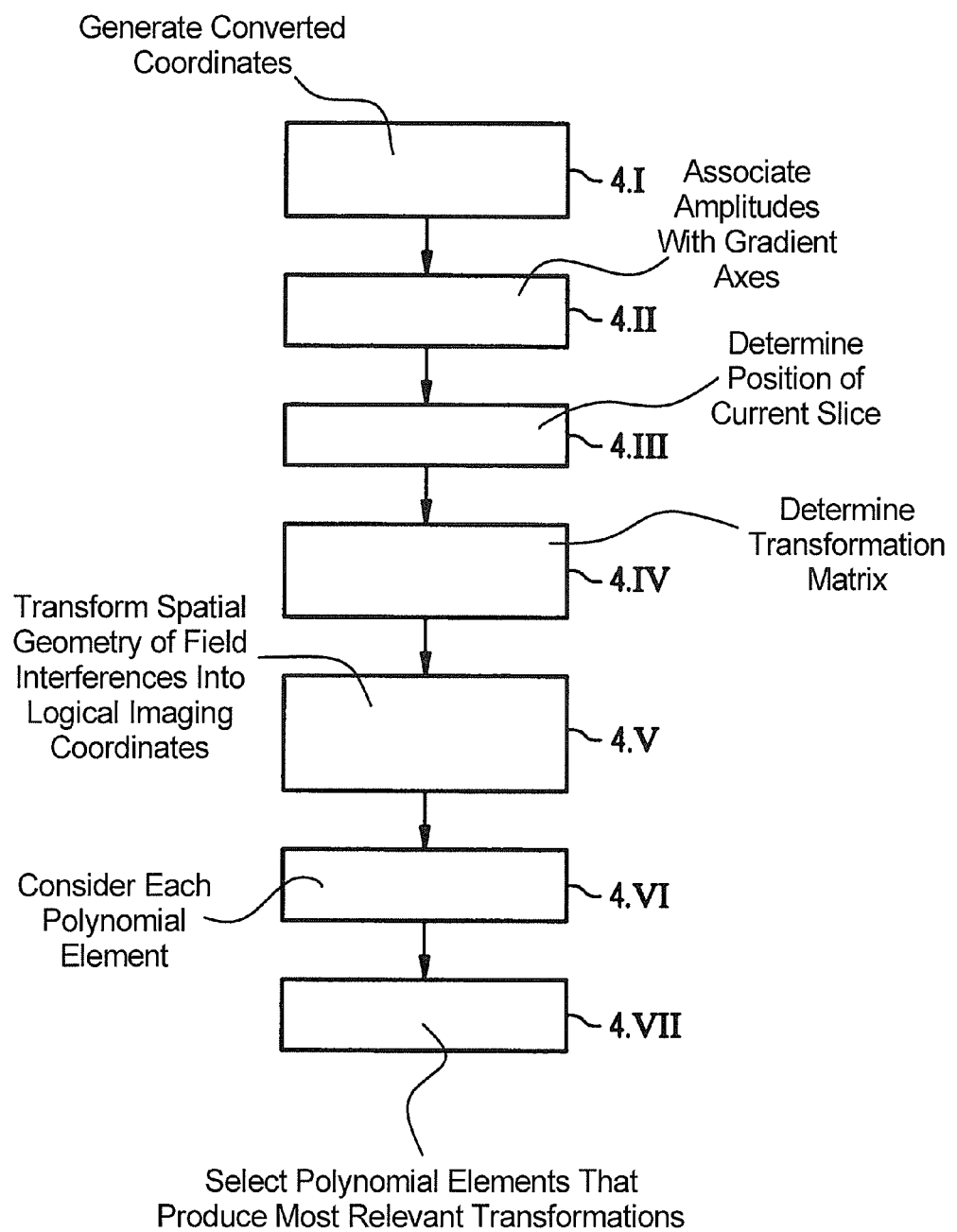

| | $r, \varphi, \theta$ | $x, y, z$ |
|---|---|---|
| $A_{00}$ | 1 | |
| $A_{10}$ | $r/r_0 \cos\theta$ | $z/r_0$ |
| $A_{11}$ | $-(3/4)^{1/2} r/r_0 \cos\varphi \sin\theta$ | $-(3/4)^{1/2} x/r_0$ |
| $B_{11}$ | $-(3/4)^{1/2} r/r_0 \sin\varphi \sin\theta$ | $-(3/4)^{1/2} y/r_0$ |
| $A_{20}$ | $(r/r_0)^2 \, 1/2 \, (3\cos^2\theta - 1)$ | $(z^2 - 1/2 \, (x^2 + y^2))/r_0^2$ |
| $A_{21}$ | $-(5/12)^{1/2} (r/r_0)^2 \cos\varphi \, 3 \cos\theta \sin\theta$ | $-(5/12)^{1/2} \, 3 \, xz/r_0^2$ |
| $A_{22}$ | $(5/48)^{1/2} (r/r_0)^2 \cos 2\varphi \, 3 \sin^2\theta$ | $(5/48)^{1/2} \, 3 \, (x^2 - y^2)/r_0^2$ |
| $B_{21}$ | $-(5/12)^{1/2} (r/r_0)^2 \sin\varphi \, 3 \cos\theta \sin\theta$ | $-(5/12)^{1/2} \, 3 \, yz/r_0^2$ |
| $B_{22}$ | $(5/48)^{1/2} (r/r_0)^2 \sin 2\varphi \, 3 \sin^2\theta$ | $(5/48)^{1/2} \, 6 \, xy/r_0^2$ |
| $A_{30}$ | $(r/r_0)^3 \, 1/2 \cos\theta \, (5 \cos^2\theta - 3)$ | $(z^3 - 3/2 \, z(x^2 + y^2))/r_0^3$ |
| $A_{31}$ | $-(7/24)^{2} (r/r_0)^3 \cos\varphi 3/2 \, (5 \cos^2\theta - 1) \sin\theta$ | $-(7/24)^{1/2} \, (6 xz^2 - 3/2 \, x(x^2 + y^2))/r_0^3$ |
| $A_{32}$ | $-(7/240)^{1/2} (r/r_0)^3 \cos 2\varphi \, 15 \cos\theta \sin^2\theta$ | $-(7/240)^{1/2} \, 15z \, (x^2 - y^2)/r_0^3$ |
| $A_{33}$ | $-(7/1440)^{1/2} (r/r_0)^3 \cos 3\varphi \, 15 \sin^3\theta$ | $-(7/1440)^{1/2} \, 15 \, (x^3 - 3xy^2)/r_0^3$ |
| $B_{31}$ | $-(7/24)^{1/2} (r/r_0)^3 \sin\varphi \, 3/2 \, (5 \cos^2\theta - 1) \sin\theta$ | $-(7/24)^{1/2} \, (6 yz^2 - 3/2 \, y(x^2 + y^2))/r_0^3$ |
| $B_{32}$ | $-(7/240)^{1/2} (r/r_0)^3 \sin 2\varphi \, 15 \cos\theta \sin^2\theta$ | $-(7/240)^{1/2} \, 3xyz/r_0^3$ |
| $B_{33}$ | $-(7/1440)^{1/2} (r/r_0)^3 \sin 3\varphi \, 15 \sin^3\theta$ | $-(7/1440)^{1/2} \, 15 \, (-y^3 + 3x^2 y)/r_0^3$ |

*FIG. 5*

FIG. 6
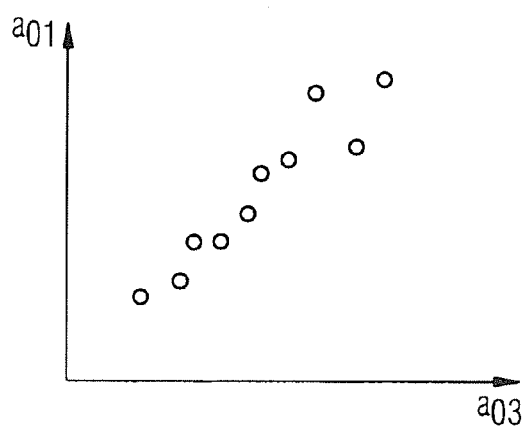
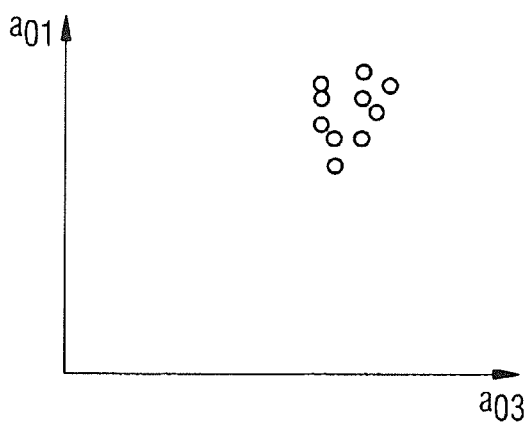

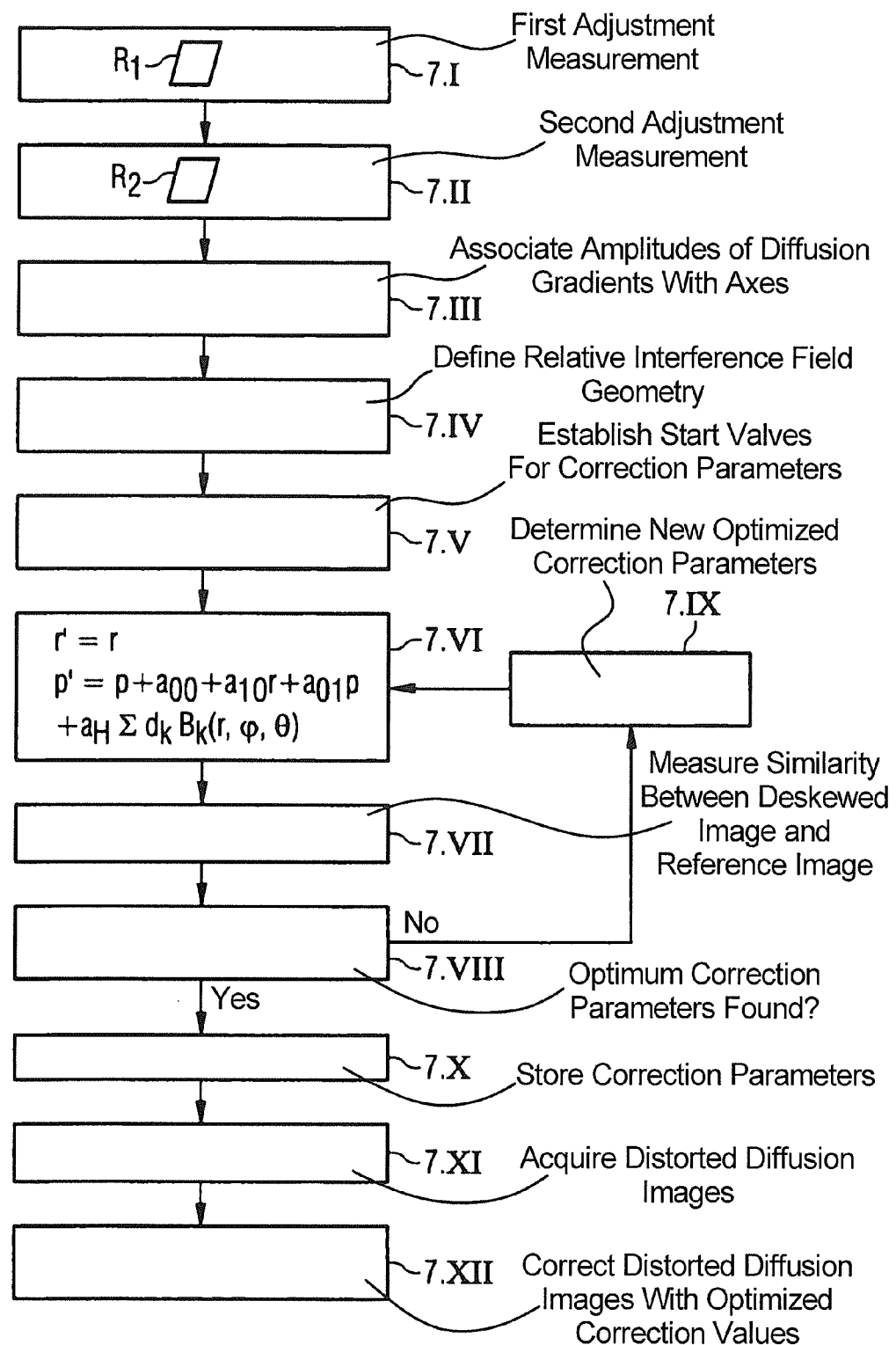

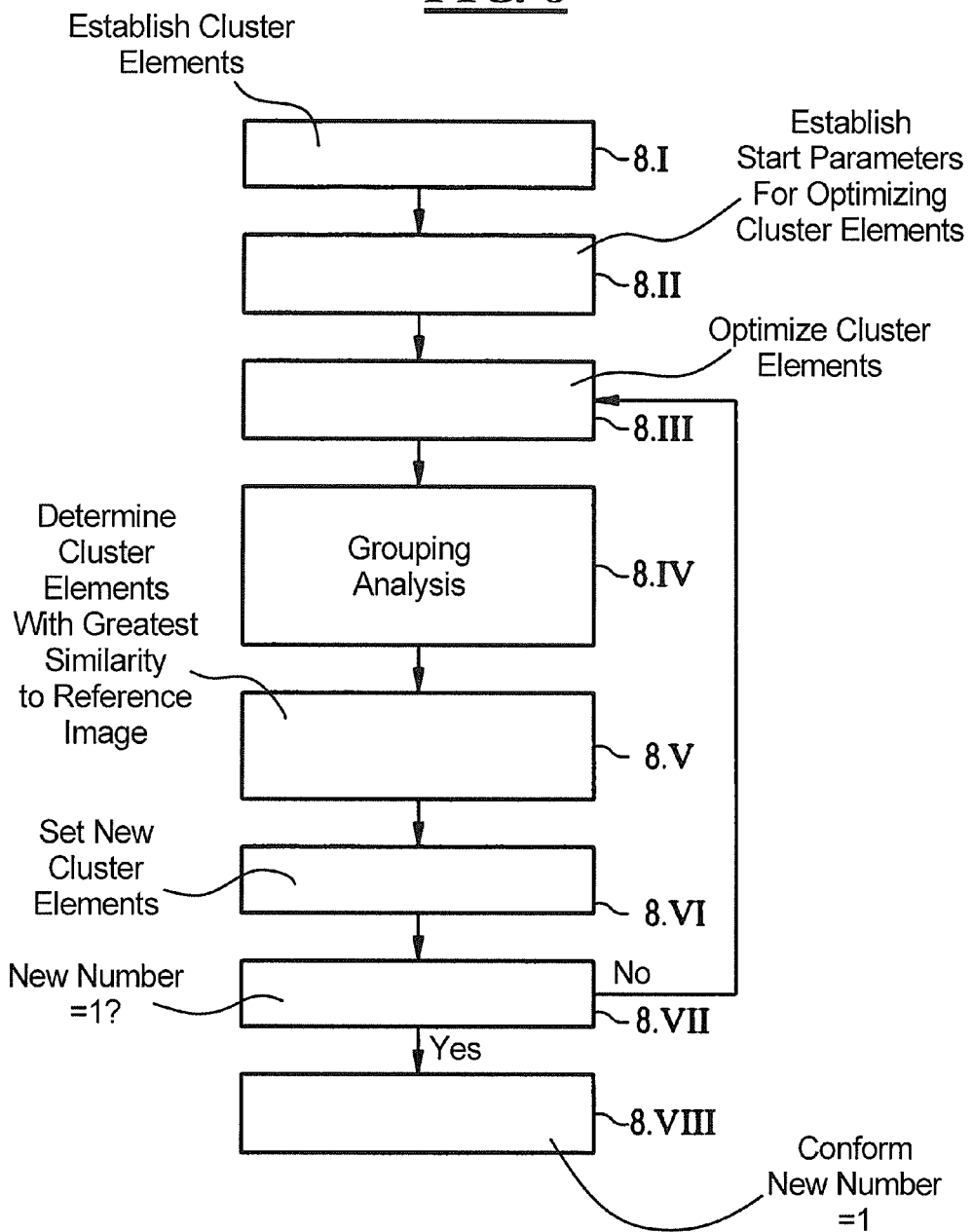

METHOD AND MAGNETIC RESONANCE SYSTEM TO REDUCE DISTORTIONS IN DIFFUSION IMAGING

BACKGROUND OF THE INVENTION

1. Field of the Invention

The present invention concerns a method to correct image distortions that can occur upon acquisition of diffusion-weighted magnetic resonance (MR) images of an examination subject, as well as a magnetic (MR) resonance system with which such a method can be implemented.

2. Description of the Prior Art

In diffusion imaging, multiple images are normally acquired with different diffusion directions and weightings, and are combined with one another. The strength of the diffusion weighting is usually defined by what is known as the "b-value". The diffusion images with different diffusion directions and weightings, or the images combined therefrom can then be used for diagnostic purposes. Parameter maps with particular diagnostic significance, for example, maps that reflect the "Apparent Diffusion Coefficient (ADC)" or the "Fractional Anisotropy (FA)", can be generated by suitable combinations of the acquired, diffusion-weighted images.

Eddy current fields can disadvantageously be caused by the diffusion gradients, these eddy current fields in turn leading to image distortions having an appearance that depends both on the amplitude of the gradients (i.e. the diffusion weighting) and on their direction. If the acquired individual images are then combined with one another with no correction in order to generate (for example) the cited parameter maps, the distortions, which are different for every image, lead to incorrect associations of pixel information and therefore to errors (or at to a reduced precision) of the calculated parameters. Particularly in diffusion-weighted images that were acquired with the use of the echoplanar technique (EPI), eddy current-dependent distortions represent a particularly significant challenge, since a particularly high sensitivity (approximately 10 Hz per pixel in the phase coding direction) to static and dynamic field interference typically exists in EPI imaging, and high gradient amplitudes are specifically used here to adjust the diffusion gradients.

Multiple image-based methods to correct eddy current-dependent distortions in diffusion imaging are known. For example, in a publication by Haselgrove et al. (in MRM 36: 960-964, 1996) a method is described in which an undistorted MR reference image is initially acquired with b=0 (i.e. without application of a diffusion gradient). Furthermore, a second adjustment measurement with slight diffusion weighting is acquired for the direction to be corrected. For example, a slight diffusion weighting thereby means a b-value of 160 s/m$^2$. It is then assumed that the distortions in the images can be described in good approximation as simple affine transformations with a scaling N, a shear S and a shift or, respectively, translation T. Distortion parameters for M, S and T are therefore determined with the aid of the two adjustment measurements, i.e. the measurement of the reference image and the image with low diffusion weighting. Using an extrapolation relationship, the distortion parameters M, S and T that are determined in this way are then utilized for the correction of the actual diffusion-weighted usable MR images in which the b-value amounts to 1000 s/m$^2$, for example. This method requires at least one adjustment measurement for each diffusion direction.

Furthermore, in a publication by Bodammer et al. (in MRM 51: 188-193, 2004) a method is described in which two images with identical diffusion direction and diffusion weighting but inverted polarity are acquired within the framework of adjustment measurements. While the diffusion contrast remains unchanged given an inverted polarity, the inversion affects the distortion as an inversion thereof. This means that an extension becomes a compression, a positive shear becomes a negative shear and a positive translation becomes a negative translation. In this method two images must be respectively acquired for every diffusion direction and for every diffusion weighting.

In an article by Zhuang et al. entitled "Correction of Eddy-Current Distortions in Diffusion Tensor Images Using the Known Directions and Strengths of Diffusion Gradients," J. Mag. Res. Imaging, Vol. 24, (2006) pp. 1188-1193, a type of adjustment method is described in which the geometric distortion properties of reference gradient pulses are measured once and then transferred to arbitrary gradient pulses according to a model.

It is common to all of the methods explained above that only the affine transformations (translation, scaling, shear)—i.e. image distortions of zeroth and first order—are taken into account in the correction. This occurs with the assumption that the dominant residual dynamic interference fields exhibit the same geometry in their spatial distribution as the causes of the interference (i.e. the diffusion gradients). However, in modern MR systems this assumption is not always correct. For example, the homologous interference fields may be compensated by a pre-distortion of the gradient pulse shape (known as the "pre-emphasis") to the extent that the residual interference fields exhibit more complex geometries. For a precise combination of the diffusion-weighted images it is thus necessary to correct image distortions that go beyond affine transformations.

In US 2007/0223832 A1 different methods are described in order to achieve a correction of the diffusion-weighted images using mutual reference between two or more diffusion-weighted images. In most of the exemplary embodiments described there, it is likewise only linear transformations that are considered. Only in a last exemplary embodiment are more complex functions used, wherein it is proposed to use a function in an entirely general form with a cubic dependency on a column index while incorporating all expansion coefficients.

In a document by Rohde et al. (in MRM 51: 103-114, 2004) a simultaneous correction of the diffusion-weighted images is described both with regard to eddy current-dependent distortions and with regard to patient movements. For the correction the distorted coordinates of the diffusion-weighted measurement are mapped to target coordinates by means of a transformation. The transformation thereby consists of a movement portion and an eddy current portion. For the geometric transformations with regard to the eddy current portion, all field geometries up to and including those of the second order that satisfy the Laplace equation are considered. This method thus goes beyond the correction of purely affine transformations. In order to achieve an even better correction, however, it would be desirable to also take into account field geometries of much higher order.

It is a problem that the correction method takes longer the more complex the geometry that is to be taken into account in the distortion correction, since the computational effort for correction rises dramatically with the increasing number of parameters to be taken into account. The use of all possible field geometries up to the 2nd order as occurs in the method by Rohde et al., already leads to a relatively high computational cost.

SUMMARY OF THE INVENTION

An object of the present invention is to provide an improved method to reduce distortions in diffusion imaging, which method also takes interference fields with more complex spatial geometry into account in the correction and is nevertheless sufficiently robust and quick. A further object is to provide a magnetic resonance system that is designed to implement a more complex spatial geometry within the scope of the invention is an interference field geometry that goes beyond an affine transformation.

Within the scope of the method according to the invention, at least one first measurement is thus initially implemented with a first diffusion weighting and at least one second measurement is initially implemented with a second diffusion weighting. Depending on how the specific additional utilization of the measurement appears, these can hereby be different measurements. For example, in the method from Haselgrove et al. one of the measurements can be a reference measurement with a diffusion weighting b=0. Analogous to the method from Bodammer et al., it is also similarly possible to implement the two measurements with identical diffusion direction and diffusion weighting but inverted polarity in order to thus arrive at different measurements. The first measurement typically serves purely as a reference or adjustment measurement. The diffusion-weighted and distorted images that are acquired in the second measurement can be used not only for the determination of the correction parameters (thus not only as an "adjustment measurement"), but also the images can be directly used for a diagnosis after the correction, for example. In this case a direct registration of the diffusion-weighted diagnostic images to reference images thus occurs using the described method (non-linear transformation with system-specific distortion correcting function). Additional usable measurements are then no longer necessary since the second adjustment measurements themselves form the usable measurements. However, since the first and second measurements in the method according to the invention are always used as adjustment measurements, they are designated as "adjustment measurements" in the following without limitation of the generality.

A non-linear, system-specific distortion correcting function is then determined on the basis of system-specific information. The term "system-specific" as used herein encompasses the term "system type-specific", meaning that information about the gradient coil design used in the system type or other structural information are used, for example.

Correction parameters for correcting diffusion-weighted magnetic resonance images are determined by applying this system-specific distortion correcting function and on the basis of the adjustment measurements. This can ensue in a known manner, for example with an iterative optimization method by means of simplex maximization of a similarity function. For example, the similarity of an adjustment image from the one adjustment image is thereby assessed with a corresponding image from the second adjustment measurement on the basis of a measure of similarity, particularly preferably on the basis of the "Normalized Mutual Information" (NMI), is found in Peter E. Latham and Yasser Roudi (2009), Scholarpedia, 4(1):1658. In the iterative method the optimal correction parameters are then determined as variables (in particular coefficients) of the distortion correcting function.

Finally, a correction of the diffusion-weighted magnetic resonance images takes place on the basis of the correction parameters and with application of the distortion correcting function. In the event that (as mentioned above) the diffusion-weighted images that are acquired in the second adjustment measurement are used not only for the determination of the correction parameters but also as "usable images", in this step these images from the second measurement are thus corrected on the basis of the correction parameters and using the distortion correcting function. Depending on the specific application case, this step can also already take place as a last adaptation step within the framework of the optimization method to determine the optimal correction parameter.

In addition to an image acquisition unit to acquire diffusion-weighted images of an examination subject and to implement at least the first measurement with a first diffusion weighting and at least the second method with a second diffusion weighting, a magnetic resonance system according to the invention requires a correction parameter determination unit. This correction parameter determination unit is fashioned so that during operation it determines a non-linear, system-specific distortion correcting function and then calculates the correction parameters to correct diffusion-weighted magnetic resonance images on the basis of the first and second measurements with application of the distortion correcting function. Moreover, the magnetic resonance system according to the invention has an image correction unit to correct the diffusion-weighted magnetic resonance images on the basis of the correction parameters. The correction parameter determination unit and the image correction unit can thereby be arranged in a central controller of the magnetic resonance system or in a separate, downstream image processing unit—for example a workstation serving as an image monitoring and processing unit—to which the data from the adjustment measurement and the diffusion-weighted images are transmitted after the reconstruction.

The method according to the invention or, respectively, the magnetic resonance system according to the invention has the advantage that on the on hand not only affine transformations but also significantly more complex geometries of the interference fields can be taken into account. On the other hand, however, the use of a system-specific distortion correcting function provides that the number of correction parameters to be determined keeps within a scope in which a robust and fast determination of the correction parameters is still possible. The distortion correcting function is additionally better adapted to the actual existing interference conditions than in previous methods, and therefore can lead to more precise corrections.

The present invention also encompasses a magnetic resonance apparatus that is designed to implement the above-described method, and all embodiments thereof, with the same advantages described in connection with the above method.

The most varied information about the system or the system type—for example the aforementioned geometric design of the gradient coils, the design and the materials of the patient tunnel and additional components that could possibly lead to interference fields upon application of gradient fields—can be utilized as system-specific information to determine the polynomial elements leading to the relevant image transformation.

The determination of the system-specific distortion correcting function can thereby also be based on heuristic information. For example, for a specific system type it can turn out that interference fields of a first order and of a specific additional term of a higher order significantly occur upon shifting of a diffusion gradient in an x-direction. This knowledge can then directly serve to establish a system-specific distortion correcting function. Other system-specific information or, respectively, methods to establish the system-specific distortion correcting function can likewise be supplemented by such heuristic information.

However, the system-specific information preferably includes direct parameters of a field geometry occurring upon application of a gradient field in the relevant magnetic resonance system. For example, the system-specific information can include to the greatest extent possible the complete mathematical description of this field geometry depending on the respective gradient field that is applied.

In a preferred exemplary embodiment of the invention, a system-specific geometry of field disruptions is determined, in order to determine the system-specific distortion correcting function for various gradient axes of the magnetic resonance system. For example, the dynamic field interferences can be measured. It is sufficient to normally implement this once for every individual system in a setup step (also called a "tuneup" step in the following) in the installation of the system, or to implement these measurements again only if structural modifications have been made to the magnetic resonance system that could possibly affect the field geometry. Such measurements can likewise be conducted within the framework of the regular maintenance.

The complete description of the system-specific geometry of the dynamic field interferences advantageously takes place in a physical coordinate system of the magnetic resonance system (i.e. of the gradient coil system) or, respectively, in typical spherical coordinates. The geometry of the interference fields of each gradient axis is thus measured and stored in x-, y-, z-coordinates, i.e. along the gradient axes of the system. Corresponding measurement methods (that are generally conducted on phantoms) are known to the man skilled in the art and therefore are not additionally explained here. The magnetic resonance system according to the invention preferably has a suitable memory in which are stored respective data about a system-specific geometry of field interferences for different gradient axes of the magnetic resonance system.

Correction of the magnetic resonance images most often takes place, however, in a logical "imaging coordinate system" with a first coordinate axis in a readout direction (this coordinate is designated in the following as an r-coordinate) and a second coordinate axis in a phase coding direction (this coordinate is designated in the following as a p-coordinate). In the adjustment measurements the magnetic resonance images are acquired in this imaging coordinate system and the acquisition of the magnetic resonance images in the later usable measurements takes place in this coordinate system. A transformation of the field interference geometry from the selected physical coordinate system (for example the x-, y-. z-coordinate system or the spherical coordinate system of the magnetic resonance system) into the logical imaging coordinate system can then take place depending on the slice position, i.e. the dependency on the location and orientation of the respective magnetic resonance image. These transformations are subsequently explained in more detail using exemplary embodiments.

Since the bandwidth is typically greater by a factor of 100 in the readout direction r than in the phase coding direction p, normally no relevant distortion occurs in the readout direction r in relationship to the phase coding direction p. Therefore a correction of the magnetic resonance images also preferably takes place only in the phase coding direction. This has the advantage that only this direction must be taken into account in the determination of the correction parameters, and thus the number of correction parameters to be determined is lower, whereby significant computing effort can be spared in the determination of the correction parameters and in the later correction with application of the correction parameters.

In a particularly preferred exemplary embodiment of the invention, the system-specific distortion correcting function has at least one function term that describes affine transformations and at least one system-specific function term. In these variants a system-specific portion of the distortion correcting function can thus be formed that describes the interferences or, respectively, transformations of a higher order, and the interferences of 0th and 1st order (the affine transformations) can be taken into account separately in the search for the associated correction parameters. This is inasmuch advantageous since in many modern MR systems active exposure compensation methods are already implemented with regard to the interferences of 0th and 1st order. The system-specific function term thereby preferably describes a system-specific interference field geometry upon emission of a specific diffusion gradient combination. For this the system-specific function term can be calculated from (for example) the previously determined, system-specific geometry of the dynamic field interferences and the knowledge of the diffusion gradients to be applied in the intended measurement, wherein it is sufficient if only the relative relationships of the amplitudes of the diffusion gradients in the three spatial directions are known relative to one another. A knowledge of the absolute amplitudes is not required. The system-specific function term advantageously contains a scaling factor as a correction factor to be determined.

In a further preferred exemplary embodiment, those polynomial elements of a non-linear polynomial transformation function that—according to a predetermined relevancy criterion—would lead to relevant image transformations under consideration of system-specific information upon application of a diffusion gradient are defined to determine a non-linear, system-specific distortion correcting function. In this variant it is thus assumed that a distortion function can be established from a polynomial transformation function of a higher order ($>1$), wherein normally only some few polynomial elements actually lead to relevant transformations in the image (i.e. to distortions) upon application of diffusion gradients. Only these polynomial elements (also called "relevant polynomial elements" in the following) are then used in the distortion correcting function. The correction parameter determination unit of an MR system according to the invention is accordingly fashioned so that it is in the position to determine the relevant polynomial elements—advantageously automatically but possibly also by querying operating inputs—and forming a corresponding distortion function. In an optimization method, the optimal correction parameters are then determined as coefficients of the polynomial elements of the distortion correcting function.

Which polynomial elements are to be classified as "relevant" in this sense depends on the individual geometry of the interference fields. The examination of the polynomial elements with regard to their relevance accordingly takes place under consideration of the system-specific information, for example on the basis of the data about the field geometry of the gradient coils, the materials used or similar data. In particular, in this method heuristic information can also be used exclusively or in part as system-specific information, meaning that a selection of the system-specific, relevant polynomial elements can also take place on a purely heuristic basis.

By using a system-specific distortion correcting function by selection of specific polynomial elements on the basis of their expected relevance in the image transformation—i.e. on the basis of their expected effects in the distortion of the images upon application of a gradient field—polynomial elements of higher order can be taken into account, and nevertheless it is ensured that the number of correction parameters to be determined remains in a very limited scope.

The relevance criterion or, respectively, the relevance criteria to establish whether an image transformation is "relevant" can be established in different ways.

A determination of the relevance of an image transformation of a polynomial element can advantageously take place on the basis of a displacement of test pixels between two magnetic resonance images generated in the adjustment measurements, which displacement is to be associated with the polynomial element. This means that a specific test pixel in a magnetic resonance image of a first adjustment measurement and the displacement of this test image pixel in a corresponding magnetic resonance image from the second adjustment measurement are considered. The test image pixels can thereby be specific, selected pixels or even all pixels of the images. A weighted evaluation of the displacement can also take place, for example a weighting by means of the image intensity of the individual pixels.

In a preferred variant the test image pixels based on which the magnitude of the displacement is determined are selected according to a defined geometric organization. For example, four pixels in four corner areas of a region of interest (ROI) of the MR images can be selected as test image pixels, or all pixels that are isotropically distributed on a defined circle around a predetermined center point of the image.

In a preferred variant, the test image pixels are selected so that they lie within an image region selected under consideration of the image content. The relevance of the transformation is then ultimately determined depending on the image content. For example, for this in which region of the image the significant information lies can initially be determined with a typical image evaluation method. This image region can have an irregular shape. However, an (advantageously rectangular) image section comprising the region of interest could particularly preferably be determined as a "bounding box". Only pixels in this image region are then considered in the evaluation of the relevance of the transformations. In addition to the improved identification of the relevant transformations or, respectively, the associated polynomial elements, the processing speed is markedly increased with this approach, and at the same time the precision of the similarity comparison can be improved given use of a similarity function for iterative determination of the correction parameters.

An additional acceleration of the method can also be achieved in that a determination of polynomial elements leading to relevant image transformations takes place under consideration of correlations between the image transformations of the polynomial elements. This means that a correlation analysis can be conducted, for example, and it can then be ensured that strongly correlated polynomial elements are not simultaneously considered since too strong a correlation can lead to the situation that the associated correction parameters can only be determined in an imprecise manner. For example, the polynomial element which leads to a transformation with a smaller magnitude can be excluded, or the polynomial element with the higher complexity (i.e. the higher order) is excluded as irrelevant.

In spite of consideration of non-affine transformations, with the method explained above the number of transformation parameters is held within limits and a robust method to discover optimal correction parameters is thus enabled. In order to improve the robustness of the method even further—in particular in the cases in which the number of polynomial elements in the distortion correcting function (and thus the number of correction parameters) should reasonably be chosen somewhat higher due to the relevance of the transformations—in a particularly preferred development of the method a hierarchical (cluster) search can be used in an iterative determination of the correction parameters. One possible method for this is explained later in an exemplary embodiment.

BRIEF DESCRIPTION OF THE DRAWINGS

FIG. 4 is a flowchart of a possible method workflow to determine the relevant transformations or polynomial elements of the distortion correcting function in the implementation of a method according to FIG. 3.

FIG. 5 is a table with spherical harmonics for use in the method according to FIG. 4.

FIG. 6 is a graphical representation of correlation graphs for use in the method according to FIG. 4.

FIG. 7 is a flowchart of the basic steps to correct distortions according to a second variant of the method according to FIG. 2.

FIG. 8 is a flow diagram to explain a possible method to implement a hierarchical cluster search in the iterative determination of the correction parameters, for example in a method according to FIGS. 2, 3 and 7.

DESCRIPTION OF THE PREFERRED EMBODIMENTS

Figure 1:
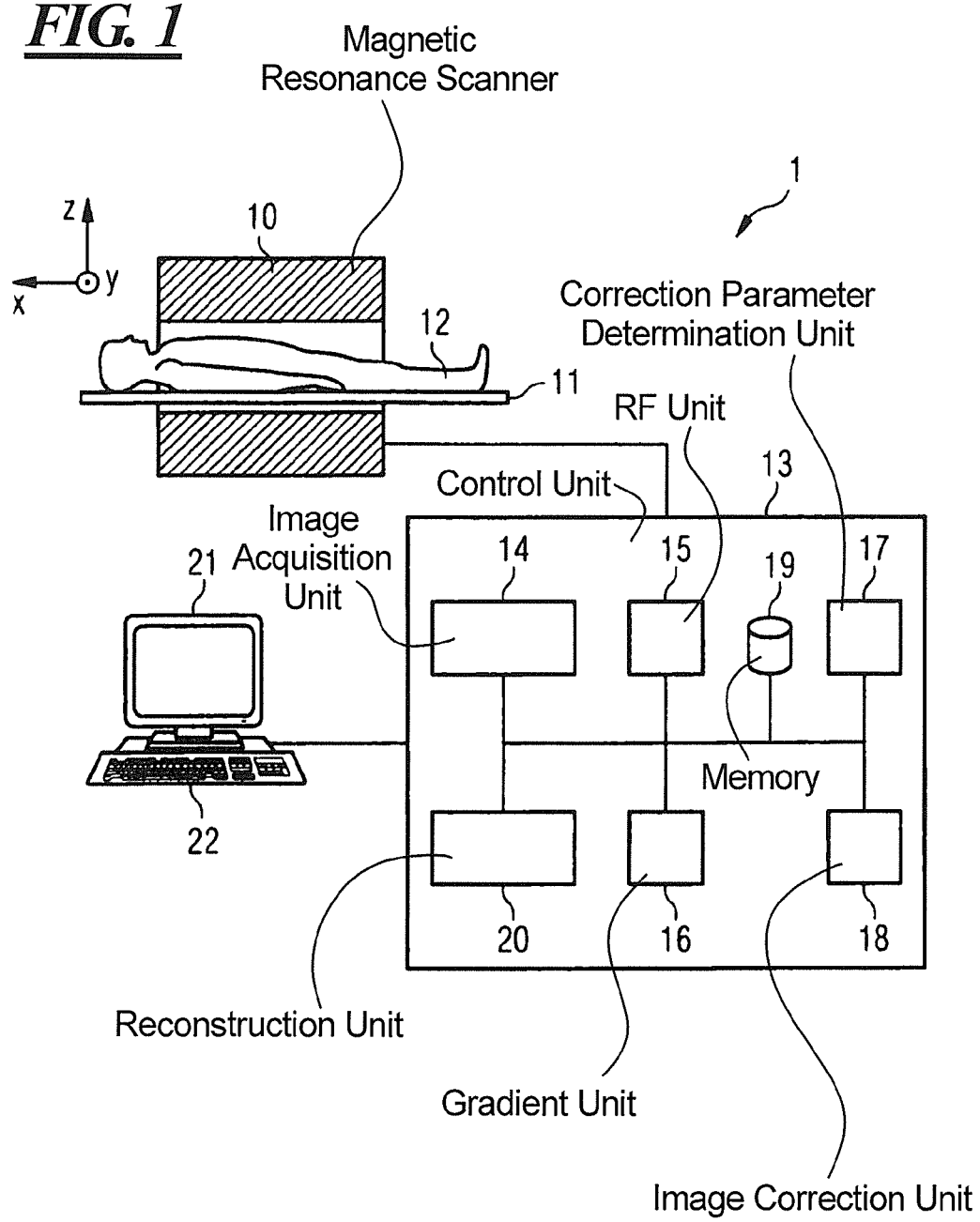
FIG. 1 is a schematic representation of an MR system according to one exemplary embodiment of the invention.

A magnetic resonance system 1 according to the invention is presented in a rough schematic in FIG. 1. It includes the actual magnetic resonance scanner 10 with an examination space or patient tunnel into which an examination subject 12 on a bed 11 can be driven. The magnetic resonance scanner 10 is equipped in a typical manner with a basic field magnet system, a gradient coil system and a transmission and reception antenna system which, for example, includes a whole-body coil permanently installed in the magnetic resonance scanner 10 and possible additional local coils that can be variably arranged on the examination subject 12.

The MR system 1 furthermore has a central control unit 13 that is used to control the entire MR system 1. The central control unit 13 has an image acquisition unit 14 for pulse sequence control. In this the sequence of RF pulses and gradient pulses is controlled depending on a selected imaging sequence. The central control unit 13 has an RF unit 15 to output the individual RF pulses and a gradient unit 16 to control the gradient coils, which RF unit 15 and gradient unit 16 communicate accordingly with the image acquisition unit 14 to emit the pulse sequences. The RF unit 15 includes not only a transmission part in order to emit the RF pulse sequences but also a reception part in order to acquire coordinated raw magnetic resonance data. A reconstruction unit 20 accepts the acquired raw data and reconstructs the MR images from these. How suitable raw data can be acquired via a radiation of RE pulses and the generation of gradient fields and how MR images can be reconstructed from these are known to those skilled in the art and need not be explained in detail here.

Operation of the central control unit 13 can take place with an input unit 22 and a display unit 21 via which the entire MR system 1 can thus also be operated by an operator. MR images can also be displayed at the display unit 21, and measurements can be planned and started by means of the input unit 22, possibly in combination with the display unit 21.

To create diffusion-weighted images, diffusion gradients of different strengths are switched (shifted) during a measurement in addition to the gradients for the spatial coding. The principle of the acquisition of diffusion-weighted magnetic resonance images is also known to those skilled in the art and therefore does not need to be explained in detail.

As explained above, the additional diffusion gradients that are shifted to create diffusion-weighted images cause a distortion in the acquired magnetic resonance images. In particular in echoplanar imaging, a displacement $V(r,p)$ of the image information within the image plane occurs dominantly along the phase coding direction p, and in fact proportional to the amplitudes of the local interference field $B(r,p)$ and inversely proportional to the pixel bandwidth BW along this direction, meaning that $$V(r, p) = \frac{B(r, p)}{BW} \quad (1)$$

Since the bandwidth BW is typically greater by a factor of 100 in the readout direction than in the phase coding direction, no relevant distortion occurs in the readout direction r. In the logical imaging coordinate system r,p, the transformation or, respectively, distortion by interference fields is therefore generally represented as follows:

$$r' = r \quad (2a)$$

$$p' = p + V(r,p) \quad (2b)$$

Only a translation T, a scaling M and a shear S have previously been taken into account in the correction, which corresponds to a representation of the function V as $V(r,p)=T+M \cdot p+S \cdot r$. However, V can generally also be written as a polynomial distortion function as follows:

$$V = \sum_{ij} a_{ij} r^i p^j = \sum_{ij} V_{ij}(r, p) \quad (3)$$

Arbitrary distortion geometries along the phase coding direction p can be described with such a distortion function. However, within the scope of the invention a polynomial transformation function can also be defined via an arbitrarily different linear combination of orthogonal functions than that which is provided in Equation (3). This equation merely represents the simplest (and therefore preferred) exemplary embodiment in the polynomial transformation function in imaging coordinates.

If the coefficients $a_{ij}$ of the function V are known, a distorted image can be calculated back into an undistorted, corrected image with the function V. The coefficients $a_{ij}$ are thus the sought correction parameters.

Figure 2:
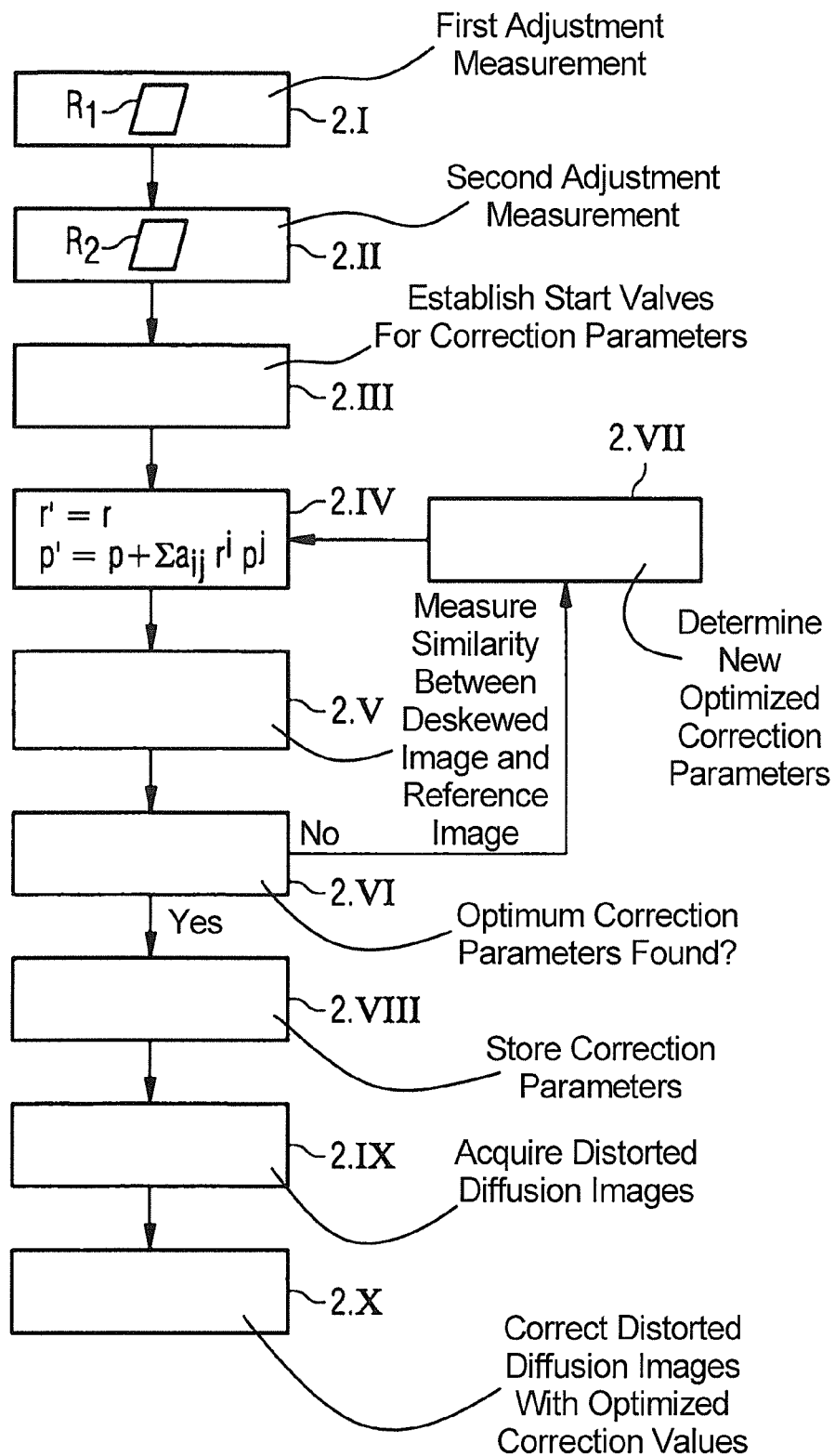
FIG. 2 is a flowchart of the basic steps to correct distortions according to an exemplary embodiment of the invention.

FIG. 2 schematically shows a possible method workflow for measurement and correction of diffusion images. In a first method step 2.I a first adjustment measurement $R_1$ is initially implemented, meaning that at least one first reference image is acquired, for example an undistorted reference image with a diffusion weighting b=0. In a second method step 2.II an additional adjustment measurement $R_2$ is subsequently implemented and at least one additional reference image is acquired that corresponds to that of the first adjustment measurement, but with a different diffusion gradient activated, and the image is correspondingly distorted by the interference field of the developer gradient.

The parameter $a_{ij}$ can then be determined, for example in an optimization method on the basis of the reference images generated in the adjustment measurements. It is iteratively sought to make the distorted image of the second adjustment measurement $R_2$ as similar as possible to the corresponding undistorted image of the first adjustment measurement $R_1$ by applying the transformation according to Equation (2b). This method naturally also functions when both reference images have been distorted differently by defined diffusion gradients, for example as in the aforementioned method according to Bodammer et al. A measure of similarity (also called a cost function) is used to assess the similarity. This means that the transformation is iteratively applied to the distorted image and it is sought to minimize the cost function or, respectively, to maximize the measure of similarity. A concrete manner of implementation is what is known as "simplex optimization" (also called "Nelder-Mead downhill simplex optimization"). Alternatively, other methods to determine the coefficients $a_{ij}$ are also possible, wherein the preferred "simplex optimization" has the advantage that no derivations of the function V are required for this.

To implement the simplex optimization, first in Step 2.III start values are established for the correction parameters, i.e. the start coefficients of the distortion correcting function. In Step 2.IV an image correction is then implemented with the distortion correcting function with the set start coefficients, wherein according to Equations (2a) and (2b) no alteration occurs in the readout direction r and a correction is only implemented in the phase coding direction p. Multiple sets of start coefficients are thereby typically started with, and for each start coefficient set a distortion map $V(r,p)$ is calculated and applied to the image (i.e. to each individual value p). Given n coefficients or correction parameters to be calculated, (n+1) start points are typically used in this method. (n+1) corrected images are then obtained. However, in principle the number of start points is arbitrary.

In Step 2.V the measure of similarity between the corrected image and the reference image is determined. For example, the "Normalize Mutual Information" NMI can be applied as a typical measure of similarity. However, other measures of similarity can also be applied in principle. A check of whether the measure of similarity is sufficiently large (and thus whether the optimal correction parameters have been found) takes place in Step 2.VI. If this is not the case, in Step 2.VII new, optimized correction parameters are determined according to a predetermined strategy (that depends on the actual selected optimization method) and with these the loop with the method steps 2.IV, 2.V, 2.VI and 2.VII is run through again beginning with Step 2.IV. This method is continued iteratively until finally it has been established in method step 2.VI that the optimal correction parameters have been found according to the predetermined strategy, for example until a termination criterion is satisfied, for example a maximum number of iterations has been reached or the images are similar except for a specifics ∈ value, The correction parameters determined in this manner are then stored in a memory in Step 2.VIII. In Step 2.IX the distorted diffusion images can subsequently be acquired and be respectively corrected in Step 2.X using the predetermined correction function with the found, optimal correction parameters.

For example, the determination of the correction parameters can take place in a correction parameter determination unit 17 of the magnetic resonance system (see FIG. 1) of the central control unit 13. The matching correction parameters can then be stored in a memory 19 by the correction parameter determination unit 17 or be transferred immediately to an image correction unit 18 that, using the distortion correcting function with the determined correction parameters, respectively corrected the magnetic resonance images reconstructed by the reconstruction unit 20.

However, in the optimization method used according to FIG. 2 it applies (as in any optimization method) the robustness of the method decreases with increasing number of parameters to be determined (because the "similarity area" [sic?] possesses an increasing number of local maxima) and the computing cost increases. For this reason a limitation of the correction parameters to be calculated is reasonable. One simple possibility would be a limitation to polynomial elements of second order:

$$V(r,p)=a_{00}+a_{10}r+a_{01}p+a_{11}rp+a_{20}r^2+a_{02}p^2 \quad (4a)$$

or third order:

$$V(r,p)=a_{00}a_{10}r+a_{01}p+a_{11}rp+a_{20}r^2+a_{02}p^2a_{21}rp^2+a_{12}r^2p+a_{30}r^3a_{03}p^3 \quad (4b)$$

However, it can be shown experimentally that a polynomial of second order still does not describe the occurring distortions with sufficient precision. However, if the polynomial distortion function of third order according to Equation (4b) is simply used as a distortion function, in total ten coefficients $a_{ij}$ must be determined as correction parameters, such that the desired robust and fast adaptation of the measurement data is often not possible. Therefore, according to the invention system-specific information is used in order to determine a non-linear, system-specific distortion correcting function that is used in Step 2.IV in the method according to FIG. 2. This distortion correcting function is non-linear, meaning that it has an order >1 and not only affine transformations. Since it is based on system-specific information the distortion correcting function has only a limited number of correction parameters to be determined.

Figure 3:
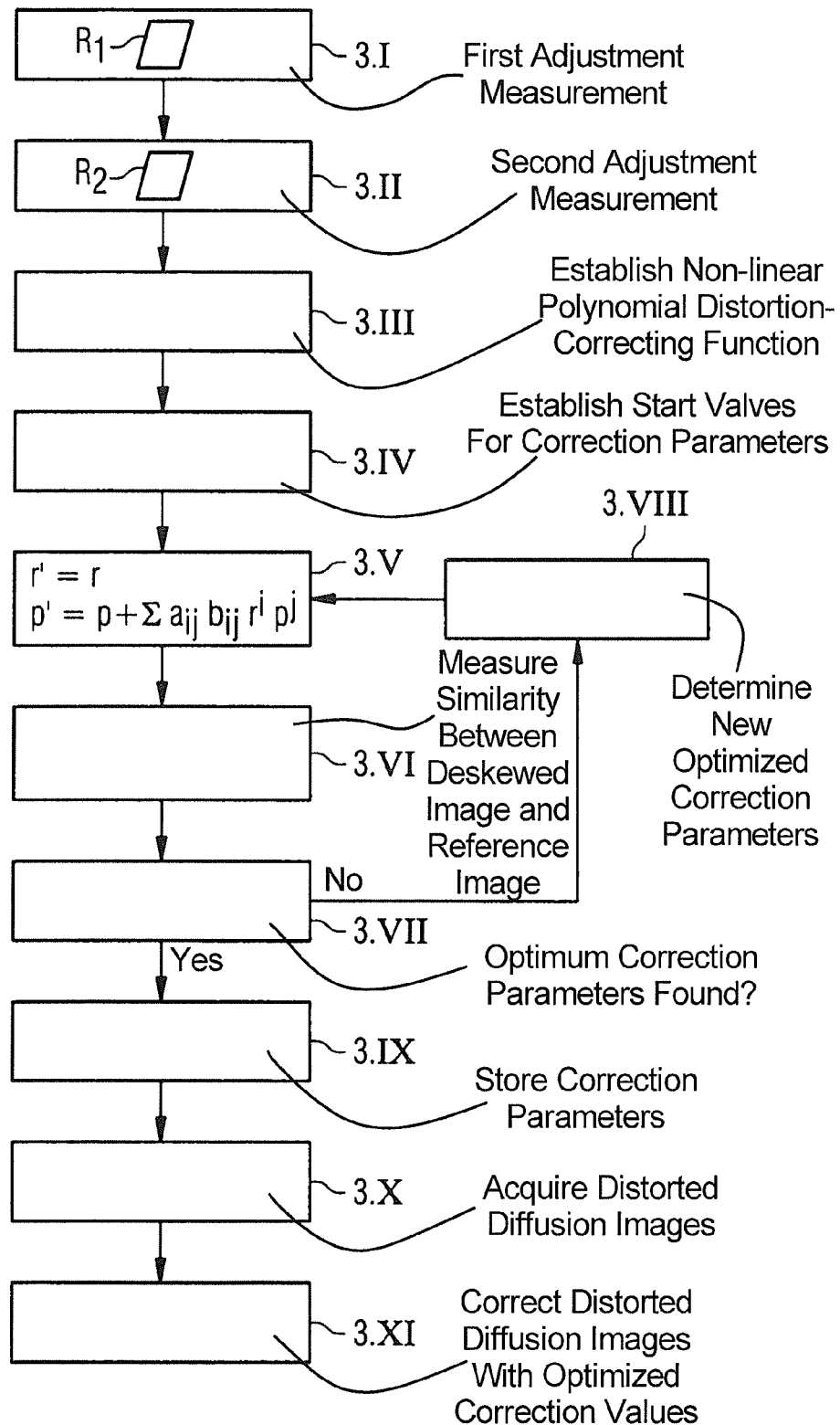
FIG. 3 is a flowchart of the basic steps to correct distortions according to a first variant of the method according to FIG. 2.

In an exemplary embodiment according to FIG. 3, the system-specific information is used in order to identify the polynomial elements in the non-linear polynomial transformation function according to Equation (4b) that lead to relevant image transformations under consideration of this system-specific information upon application of a diffusion gradient during the measurement, wherein the relevance of the image transformations is assessed with a predetermined relevancy criterion. It is noted that in the following the formulations that "relevant transformations" or "relevant polynomial elements" that are selected are also used synonymously, even if naturally which polynomial elements lead to relevant transformations is checked and these polynomial elements are then selected for the distortion function.

This establishment of a non-linear polynomial distortion correcting function via selection of the relevant polynomial elements in the transformation function according to Equation (4b) takes place in Step 3.III. Steps 3.I and 3.II of the method according to FIG. 3 can coincide with Steps 2.I and 2.II of the method according to FIG. 2, and Steps 3.IV through 3.XI can correspond to Steps 2.III through 2.X. In contrast to the equation used in Step 2.IV of FIG. 2, the additional coefficients $b_{ij}$ within the sum formula shown in Step 3.V in FIG. 3 are (for example) set to 1 for all polynomial elements that are considered to be relevant and set equal to 0 for all polynomial elements that are not considered to be relevant. In this way a distortion correcting function is automatically used which contains only the relevant polynomial elements.

In a simplified variant, the selection of the relevant transformations or, respectively, polynomial elements can take place completely or additionally on the basis of heuristic information. For example, it is found in measurements of longer duration with high gradient load that thermal effects can lead to a distortion of the basic field. In echoplanar imaging, this appears as an image shift along the phase coding direction. If the reference image was now acquired at a first amplitude of the basic field and the image to be corrected was acquired at a second amplitude, in any case a transformation term $a_{00}$ is to be taken into account in the distortion correction. Depending on the system type, thermal effects of higher order (for example first or second order) can also occur that can be taken into account in the same manner.

A more detailed presentation of a possible, mathematically more precise method to select the relevant polynomial elements of a non-linear polynomial transformation function—for example according to Equation (4b)—is shown in FIG. 4.

Given this selection method the knowledge of the spatial geometry of the generated interfering eddy current fields is advantageously used without it being necessary to know the absolute amplitude of these eddy current fields. The geometry of the eddy current fields is namely a system property due to the design of the components (for example of the gradient coil) of the eddy current surfaces in the magnet as well as the individual manufacturing tolerances. For example, if a gradient pulse with a defined time curve and defined amplitude is applied to an axis of the gradient coil, a reproducible interference field results with a defined geometry and a defined temporal decay. However, since the dominating portions of the reproducible interference field exhibit relatively long time constants and can be viewed as temporally constant in the case of an echoplanar scan, the temporal decay of the interference fields can be ignored for the following considerations. In contrast, the spatial geometry of the interference field merely depends on the gradient axis (x, y, z) that is used or, respectively, (given simultaneous pulses on multiple physical axes) on the linear combination that is used and shows no dependency on the time curve or the amplitude of the generated gradient pulse. The amplitudes of the gradient pulses and their time curve only have influence on the amplitude of the interference field, i.e. on its scaling.

This realization can be utilized within the scope of the invention in order to measure and store the geometry of the interference fields of each gradient axis for every individual system in a tune-up step, for example in the installation of the system and/or within the framework of the regular maintenance. Corresponding measurement methods that are generally conducted on phantoms are known to those skilled in the art and therefore need not be explained further herein. This tune-up step is shown as Step 4.I in FIG. 4. The measured geometric information can likewise be stored in a memory 19 of the system 1 (see FIG. 1) that can then be queried as needed by the correction parameter determination unit 17 in order to implement additional calculations with said information.

Due to the symmetry of the components, the field geometries are normally expressed in the form of spherical harmonics, for example for the gradient axis in the x-direction in the form $$B_x(r, \varphi, \theta) = \sum\sum A_x(n, m) Norm(n, m)(r/r_0)^n \cos(m\varphi) P_n^m(\cos(\theta)) + \quad (5)$$
$$\sum\sum B_x(n, m) Norm(n, m)(r/r_0)^n \sin(m\varphi) P_n^m(\cos(\theta))$$

with a suitable normalization (for example what is known as the L-Norm 4):

$$Norm(n, 0) = 1 \quad (6)$$

$$Norm(n, m) = (-1)^m \left( \frac{(2n+1)(n-m)!}{2(n+m)!} \right)^{\frac{1}{2}}$$

The reference radius $r_0$ and the coefficients $A_x(m,n)$ and $B_x(n,m)$ to be measured. $P_n{}^m(x)$ are the Legendre functions of the first type. Equation (5) can also be written as $$B_x(r,\phi,\theta) = \Sigma\Sigma A_x(n,m) A_{nm} + \Sigma\Sigma B_x(n,m) B_{nm} \quad (7)$$

The spherical harmonics $A_{nm}$ and $B_{nm}$ that are specified in Equation (7) are indicated in the table in FIG. 5 up to the third order for the polar coordinates $r, \phi, \theta$ on the one hand (left column) and for the Cartesian coordinates of the system x, y, z on the other hand (right column). With the aid of the depiction provided in Equation (7) and in the table in FIG. 5, the field geometry in the x-direction can thus be completely mathematically described up to the third order in that the coefficients $A_x(0,0) \ldots B_x(3,3)$ are simply specified. The field geometries $B_y(r, \phi, \theta)$ and $B_z(r, \phi, \theta)$ in the y-direction and in the z-direction can be described in the same way.

With knowledge of the determined coefficients, in a tune-up step 4.1 for each x-, y-, z-coordinate the geometry of the interference field generated by the respective gradient can consequently be specified precisely in polar coordinates $r, \phi, \theta$ according to Equation (7) and then be converted into (for example) x-, y-, z-coordinates in a form $B_x(x, y, z)$, $B_y(x, y, z)$ and $B_z(x, y, z)$.

If a diffusion coding with a normalized diffusion direction is now applied for a concrete measurement, given knowledge of the interference fields $B_x(x, y, z)$, $B_y(x, y, z)$ and $B_z(x, y, z)$ generated by the individual diffusion gradients the total spatial interference field that is generated is to be mapped to the transformation that results from this in the image plane (thus into r-, p-coordinates) according to $$B(x,y,z) = b_x B_x(x,y,z) + b_y B_y(x,y,z) + b_z B_z(x,y,z) \quad (8)$$

$b_x, b_y, b_z$ are the relative amplitudes of the diffusion gradients (i.e. the amplitude values relative to one another or, respectively, relative to a standard value).

The dominating r, p transformations can then be identified and only these are taken into account in the optimization process in order to thus increase the robustness and the processing speed of the entire correction method. The additional steps for this are presented in FIG. 4 in Steps 4.II through 4.VII. These steps must be respectively re-implemented for each measurement of the current determination of the correction parameters, which is different than for the method step 4.I. In method step 4.II the relative association of the amplitudes $b_x, b_y, b_z$ of the diffusion gradients with the individual gradient axes is thereby initially determined. A determination of the position (i.e. the bearing and orientation) of the current slice then takes place in method step 4.III for the imaging within the x-, y-, z-coordinate system.

In general the logical r, p imaging coordinate system is shifted, rotated and scaled relative to the x-, y-, z-coordinate system. In Step 4.IV the transformation matrix T between physical and logical coordinates and the center of symmetry of the transformation must therefore then be determined for the current slice. This can take place in the following manner:

$$\begin{pmatrix} x \\ y \\ z \end{pmatrix} = \begin{pmatrix} x_0 \\ y_0 \\ z_0 \end{pmatrix} + T \begin{pmatrix} p \\ r \\ s \end{pmatrix} = T \begin{pmatrix} p - p_0 \\ r - r_0 \\ s - s_0 \end{pmatrix} \quad (9)$$

with $$T = R \cdot Res = \begin{pmatrix} P_x & R_x & S_x \\ P_y & R_y & S_y \\ P_z & R_z & S_z \end{pmatrix} \cdot \begin{pmatrix} P_{res} & 0 & 0 \\ 0 & P_{res} & 0 \\ 0 & 0 & P_{res} \end{pmatrix} \quad (10)$$

wherein R represents the matrix of the direction cosines between the axes of the two coordinate systems, Res is the diagonal matrix with the resolution information (i.e. this matrix contains the conversion factors for the conversion from pixel positions to millimeter values and vice versa. The vector $(x_0, y_0, z_0)$ describes the center of the current slice. The coordinate s in the direction of the slice perpendiculars is always zero in this convention. The center of symmetry of the interference fields in the normal case lies at the isocenter of the magnet, i.e. given $(x, y, z)=(0, 0, 0)$ or, respectively, $(p, r, s)=(p_0, r_0, s_0)$. In order to keep the different transformations as independent from one another as possible, it suggests itself to describe all transformations relative to this defined zero point in the acquired slice. In total the coordinate transformation can thus be represented as:

$$x = T_{11}(p-p0) + T_{12}(r-r0) + T_{13}(s-s0)$$

$$y = T_{21}(p-p0) + T_{22}(r-r0) + T_{23}(s-s0)$$

$$z = T_{31}(p-p0) + T_{32}(r-r0) + T_{33}(s-s0) \quad (11)$$

If the coordinates x, y, z from Equation (11) are inserted into the right column of the spherical harmonic according to the table in FIG. 5, the spherical polynomials $A_{00} \ldots B_{33}$ are obtained for the coordinates r, p, s so that via insertion into Equation (7) the geometry of the interference fields $B_x(r,p,s)$, $B_y(r,p,s)$, $B_z(r,p,s)$ for the individual gradient axes x, y, z in the imaging coordinates r, p, s are obtained. Since is constant, the interference fields can also be written abbreviated as $B_x(r,p)$, $B_y(r,p)$, $B_z(r,p)$. The complete interference field geometry then results as $$B(r,p) = c_x B_x(r,p) + c_y B_y(r,p) + c_z B_z(r,p) \quad (12)$$

The coefficients $c_k$ (with k=x,y,z) are thereby not yet known, but their ratio to one another (i.e. the relative size) is provided by the diffusion measurements.

According to Equation (1), the interference field B(r,p) that is determined in this way essentially corresponds to the sought function V(r,p) so that the relative coefficients for the transformations in the image plane can also be determined by sorting the individual components of the function B(r,p) according to the polynomials in r,p. However, it explicitly noted again that these are not the absolute coefficients $a_{ij}$ that must still be determined later within the scope of the correction method, but rather are only the relative values in relation to one another.

This transformation of the spatial geometry of the field interferences for the diffusion measurement into the logical imaging coordinates takes place in Step 4.V of the method workflow shown in FIG. 4.

For example, for each polynomial element of the polynomial transformation function according to Equation (4b), the magnitude of the corresponding pixel shift in the image relative to the pixel shifts caused by the other polynomial elements can then be considered on the basis of the previously acquired information about the interference field geometry (Step VI), and those polynomial elements that actually lead to relevant transformations or to the "most relevant" transformations can thus be selected in Step 4.VII.

To establish whether a transformation is relevant, a calculation of the respective pixel shift at selected points of the image plane in magnetic resonance images corresponding to one another can be identified from the current adjustment measurements that are implemented for the respective usable measurement. For example, a set of test image pixels or, respectively, test points $(r_i, p_i)$ can thereby be established (possibly also with a weighting $W_i$) that describes the region of interest (ROI) in the image. For example, four points could be defined as follows:

$$(r_1,p_1)=(-FOV_r/2, -FOV_p/2)$$

$$(r_2,p_2)=(-FOV_r/2, +FOV_p/2)$$

$$(r_3,p_3)=(+FOV^r/2, -FOV_p/2)$$

$$(r_4,p_4)=(-FOV_r/2, +FOV_p/2) \quad (13)$$

wherein $FOV_r$ and $FOV_p$ specify the image field (field of view) in the readout direction r and in the phase coding direction p.

In an alternative variant the test image pixels at which the shift is calculated are distributed isotropically in the slice on a circle with radius FOV/2. The number of points is determined from the highest order n of the field interferences to be corrected. Since the number of field extremes amounts at most to $2^n$, at least $(2^n+1)$ points on the circle must be used for the calculation of the pixel shift in order to avoid undersampling.

For each of the test image pixels, the sum of the absolute magnitudes of the pixel shift $V_{ij}(r,p)$ is then determined and, for example, those transformations with the greatest values can be classified as a relevance criterion. For this a fixed number of transformations can be predetermined, for example the five transformations with the greatest contributions. This means that only five polynomial elements are definitively accounted for within the polynomial distortion function. Alternatively, a limit value can also be established as a relevancy criterion, for example. For example, all transformations that lead to a pixel shift of more than two pixels in the center can be taken into account. Combinations of the most varied relevancy criteria are likewise also possible. Furthermore, a number of transformations can also always be taken into account in a targeted manner, for example the affine transformations. Moreover, a specific number (for example two) of additional relevant transformations is then permitted according to the previously cited criteria. Furthermore, a number of transformations can also be specifically excluded, for example because the associated correction parameters or polynomial coefficients prove to be unstable in the registration.

In order to avoid that such points that are not representative of the actual image content are selected as test image pixels for the determination of the relevance of the individual transformations (for example if the significant image information is concentrated only in the upper left corner of the image or in a small central region of the image etc.), the relevance of the transformation is advantageously determined depending on the image content. For this the region of the image that contains the significant information can be determined initially via application of an intensity threshold. This image region can also have an irregular shape. In this case a rectangle comprising the relevant region can advantageously be established as a "bounding box". The transformations that have the greatest effect in this image region or at test image pixels selected within this image region are then classified as relevant and used.

In addition to the improved identification of the relevant transformations, with this approach the processing speed is markedly increased and at the same time the precision of the similarity comparison is improved. The first point is due to the reduction of the image section that is to be considered; the last point is due to the exclusion of large noise regions. However, the calculation of the cost function should reasonably be limited only to the relevant region; the entire original image then remains for the image transformation. If the image were also limited to the relevant image section for the transformation, portions of the image could slide out of the overlap region with the reference image and other portions could slide in due to the transformation. Possible unwanted jumps [discontinuities] in the cost function could thereby arise.

Specific polynomial elements or, respectively, transformations in the polynomial function according to Equation (4b) can exhibit a very similar spatial behavior (response). For example, this applies for the most part for the transformations $V_1(r,p)=a_{01} \cdot p$ and $V_2(r,p)=a_{03} \cdot p^3$. Such strong correlations lead to the situation that the correction parameters or, respectively, coefficients $a_{01}$ and $a_{03}$ can be determined only imprecisely since the energy surface of the similarity function along these two dimensions is very flat and exhibits a great many local maxima. Although the registration of a distorted image with an undistorted reference image can still deliver good results, the results can become increasingly more inaccurate if the parameters are used in the course of an extrapolation method.

Therefore, in a preferred variant of the method the use of two transformations that correlate strongly with one another can be avoided given the assessment of the relevance. For this the strength of the per pair correlations can initially be determined. One possibility for correlation determination is based on the heuristic analysis of the spatial transformation properties. For example, p and $p^3$ exhibit similar transformation geometries. Correlations can be determined more precisely via a statistical analysis. Therefore, according to a first hierarchy step the determined n-sets of "more optimal" transformation parameters are considered. For example, for each set the determined coefficients of the p-transformation are then depicted versus the determined coefficients of the $p^3$ transformation in an $a^{09}/a^{03}$ diagram. If the transformations are strongly correlated, the data points are arranged along a line. For example, this case can be identified by calculating a correlation coefficient. Such a case is shown above in FIG. 6. Here a clear arrangement of the data points appears along a line.

There are two possibilities in order to avoid this. On the one hand, a "more expensive" measure of similarity can be used. Such a more expensive measure of similarity can be achieved via more "binnings" in the MRI or via an oversampling of the image information, whereby the precision increases such that the strength of the correlation is sufficiently reduced. What is understood by a "binning" is the number of sub-divisions of a histogram. The effect of the decorrelation by using a more expensive measure of similarity is shown below in FIG. 6. Alternatively one of the two strongly correlated transformations can be excluded. For example, the transformation with the smaller contribution, or that with the greater complexity (i.e. the higher order), can be excluded.

It is noted that in the previously described methods the relevant transformations or, respectively, the associated, relevant polynomial elements depend on the position and the orientation of the respective image plane. Different transformations can thus be relevant to different slices of an image stack, and the distortion correcting function can also accordingly look different. Moreover, the selection of the relevant transformations also depends on the diffusion direction.

As explained above, given knowledge of the determined coefficients from the tune-up step and, for example the spherical harmonics given in the table in FIG. 5 the geometry of the interference field generated from the respective gradient according to Equation (7) can be precisely specified mathematically up to the third order, and therefore the spatial interference field that is generated as a whole can be described according to Equation (12) in r,p imaging coordinates for a concrete measurement with known, normalized diffusion direction. Given application of spherical function of higher order, terms of a correspondingly higher order can naturally also be taken into account. A reasonable upper limit of the order results from the resolution of the measurement method used in the tune-up step.

The interference field can also be described absolutely in good approximation with a global scaling factor $a_H$ corresponding to Equation (12)

$$B(r, p) = a_H \cdot \left( \frac{c_x}{a_H} \cdot B_x(r, p) + \frac{c_y}{a_H} \cdot B_y(r, p) + \frac{c_z}{a_H} \cdot B_z(r, p) \right) \quad (14)$$
$$= a_H \sum_{k=x,y,z} d_k B_k(r, p)$$

wherein $c_k/a_H = d_k$ is set in the last step. According to Equation (1), B(r,p) can be equated with the sought distortion function V(r,p) except for the given factor BW.

Under the assumption of an ability to separate the temporal and spatial dependency of the dynamic interference fields and a negligibility of the time changes, the description of the interference field B(r,p) according to Equation (14) can also be drawn upon directly to correct the distorted images, wherein the scaling factor $a_H$ would be to be determined as a correction parameter. However, since (as explained above) the eddy currents of 0th and 1st order are actively compensated in modern systems, it is reasonable to handle these separately and to set up a distortion function V(r,p) as follows:

$$V(r, p) = a_{00} + a_{11}r + a_{01}p + a_H \sum_{k=x,y,z} d_k B_k(r, p) \quad (15)$$

Given application of this distortion correcting function, the coefficients $a_{00}$, $a_{11}$, $a_{01}$ for the affine transformations and additionally the scaling factor $a_H$ are thus sought as correction parameters, for example in an optimization method. It is thereby to be heeded that the individual interference fields $B_k(r,p)$ do not need to be identical with those in Equation (14); rather, the terms of 0th and 1st order can be removed here since these terms are handled separately. The scaling factor $a_H$ is accordingly also different than in Equation (14).

FIG. 7 shows a flow chart for a corresponding correction method. Steps 7.I and 7.II of this method coincide with the steps 2.I and 2.II of the method according to FIG. 2. In Step 7.III a relative association of the amplitude $d_k$ of the diffusion gradients with the gradient axes occurs, for example (1, 1, 0). In Step 7.IV the relative interference field geometry $B_k(r, \phi, \theta)$ is then defined in spherical coordinates or $B_k(x, y, z)$ in the Cartesian coordinate system of the system for each gradient axis k. In Step 7.V start values are defined for the coefficients or, respectively, correction parameters $a_{00}$, $a_{10}$, $a_{01}$, $a_H$. An image correction with the distortion correcting function according to Equation (15) subsequently takes place in Step 7.VI with the used start coefficients, analogous to Steps 2.IV in FIG. 2 or 3.V in FIG. 3. For this purpose the coefficient transformation of the interference field geometry $B_k(r, \phi, \theta)$ from the spherical coordinates or, respectively, $B_k(x, y, z)$ from the Cartesian coordinates into the interference field geometry Bk(r,p) in the imaging coordinate system—which coordinate transformation is described above—is respectively implemented depending on the slice position. Steps 7.VII through 7.XII can again corresponding to Steps 2.V through 2.X.

In the method according to FIG. 7, only four coefficients must thus be determined, and nevertheless the system-specific interference field geometry can be completely accounted for. No limitation to terms up to the 3rd order is thereby necessary; rather, in principle transformations up to an arbitrary order can be accounted for.

In order to further improve the robustness of the iterative method to determine the optimized correction parameters in all cited method versions, what is known as a "hierarchical cluster search" can be used. A possible method workflow for this is shown in FIG. 8.

For this purpose, a number S of cluster elements is established in a first Step 8.I.

In Step 8.II a set of start parameters for the optimization is then established for each of these cluster elements. In the selection of cluster elements, a reasonable order of magnitude of the individual parameters should be used, i.e. that a maximum shift of two pixels within the relevant image region takes place for every individual transformation, for example. Moreover, it should be assured that the cluster elements differ sufficiently from one another, meaning that the associated started parameters differ homogeneously in a multidimensional parameter space. In Step 8.III, for each of the S sets of start parameters, the selected optimization method is then run independently, and in fact with an "advantageous" similarity function (for example with an NMI with low number of binnings) to shorten the processing time. In general, a separate set of "more optimal" correction parameters is then determined for each of these optimizations.

In a further Step 8.IV these S sets of "more optimal" correction parameters are then subject to a grouping analysis. For example, the mutual separations (intervals) of the "optimal" correction parameters are thereby determined in multi-dimensional space and one or more groups with similar, "optimal" correction parameters is determined on this basis. For example, it can be defined that two cluster elements then belong to the same group if they are located at a distance less than a minimum distance from one another given the selected separation measure, or when they can be connected by a chain of other cluster elements with such a respective separation less than the limit separation.

In a next method step 8.V the cluster element is with the greatest similarity to the reference image is determined for each group. All other cluster elements are discarded.

In Step 8.VI the number of previously determined groups is then set as a new number S of cluster elements.

In Step 8.VII it is checked whether the new number S of cluster elements is equal to 1. If this is not the case, an optimization is implemented again for the new cluster elements and the method steps 8.III through 8.VII are run through again. This second stage can then operate with a "more expensive" but thus more precise similarity function until finally it is established in Step 8.VIII that the current number S of cluster elements or groups amounts only to 1. The method can then be ended in Step 8.VIII.

It has turned out that in general a double pass of the loop is sufficient in order to arrive at one remaining cluster element. However, if necessary the search can also be continued in additional hierarchy levels, meaning that the Loop can be run through more than twice. Such a hierarchical cluster search not only increases the robustness of the method but also forms the basis for statistical analyses for additional method improvements.

The method described here can also be used advantageously within the framework of the method described in DE 10 2009 003 889 for improvement of the correction of image distortions. At least one of the two adjustment measurements is thereby respectively implemented with a predetermined diffusion weighting in three orthogonal diffusion directions and correction parameters for the three orthogonal diffusion directions are determined based on this. Correction parameters for diffusion-weighted MR images with arbitrary diffusion direction can then be determined via linear combination from the correction parameters for the three orthogonal diffusion directions.

Furthermore, in the implementation of the method both the methods from Bodammer et al, and those from Haselgrove et al. can be used. In the method described by Haselgrove, the first adjustment measurement with the first diffusion weighting corresponds to the reference measurement without diffusion gradient. In this case this means that the first diffusion weighting would be zero. The second adjustment measurement can then be implemented with the predetermined diffusion weighting in the three orthogonal diffusion directions, for example. Given application of the method according to the invention to the method from Bodammer et al., the first adjustment measurement with the first diffusion weighting would be the negative diffusion weighting, for example, while the second adjustment measurement would be the measurement with the same positive diffusion weighting.

Given the adjustment measurements the movement of the examination subject can likewise be detected, wherein the correction parameters are only used for the correction of the diffusion-weighted MR images when the movement is less than a predetermined limit value. Refer to DE 10 2009 003 889 (the contents of which are inasmuch incorporated here) for the details of the aforementioned method.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for reducing distortions in diffusion-weighted magnetic resonance images of an examination subject, comprising the steps of:
    operating a magnetic resonance data acquisition system to acquire magnetic resonance data in a first measurement with a first diffusion weighting;
    operating said magnetic resonance data acquisition system to acquire magnetic resonance data in a second measurement with a second diffusion weighting that is different from said first diffusion weighting;
    in a computerized processor, automatically determining a non-linear, system-specific distortion-correcting function based on information that is specific to said magnetic resonance data acquisition system;
    in said computerized processor, calculating correction parameters, by applying said system-specific distortion-correcting function to said magnetic resonance data acquired in said first and second measurements, to correct distortions in subsequently-acquired diffusion-weighted magnetic resonance images; and
    operating said magnetic resonance data acquisition system to acquire a diffusion-weighted magnetic resonance image of the examination subject that embodies distortions therein and, in said computerized processor, applying said correction parameters to said diffusion-weighted magnetic resonance image to correct said diffusion-weighted magnetic resonance image to at least reduce said distortions therein.

2. A method as claimed in claim 1 comprising determining said non-linear, system-specific distortion-correcting function using, as said system-specific information, a field geometry that occurs upon activation of gradient field in said magnetic resonance data acquisition system.

3. A method as claimed in claim 1 comprising determining said non-linear, system-specific distortion-correcting information based on heuristic system-specific information.

4. A method as claimed in claim 1 comprising determining said non-linear, system-specific distortion-correcting function for respectively different gradient axes of said magnetic resonance data acquisition system, by determining a system-specific geometry of field interferences for each of said different gradient axes.

5. A method as claimed in claim 4 comprising, for each of said different gradient axes, determining the system-specific geometry of the field interferences in a physical coordinate system and distortion correcting the diffusion-weighted magnetic resonance images in a logical imaging coordinate system having a first coordinate axis in a readout direction and a second coordinate axis in a phase coding direction, said magnetic resonance data in said first and second measurements being acquired in said logical imaging coordinate system, and transforming the field interference geometry from the physical coordinate system into the imaging coordinate system dependent on a slice position of the diffusion-weighted magnetic resonance image.

6. A method as claimed in claim 1 comprising correcting said diffusion-weighted magnetic resonance images only in a phase coding direction.

7. A method as claimed in claim 1 comprising determining said non-linear, system-specific distortion-correcting function with at least one function term that describes affine transformations and at least one system-specific function term.

8. A method as claimed in claim 7 comprising employing, as said system-specific function term, a system-specific interference field geometry that results upon activation of a specific diffusion gradient combination.

9. A method as claimed in claim 1 comprising employing a non-linear polynomial transformation function having polynomial elements that define said non-linear, system-specific distortion-correcting function, said polynomial elements causing an image transformation according to a predetermined relevancy criterion with respect to said system-specific information.

10. A method as claimed in claim 9 comprising determine relevancy of said image transformation of polynomial element by shifting text image pixels between respective magnetic resonance images generated in said first and second measurements, said test image pixels being associated with the polynomial element.

11. A method as claimed in claim 10 comprising selecting said test image pixels according to a defined geometric order.

12. A method as claimed in claim 10 comprising selecting said test image pixels to lie within an image region that is selected dependent on image content.

13. A method as claimed in claim 10 comprising determining polynomial elements that lead to relevant image transformations dependent on a correlation between the image transformations of the respective polynomial elements.

14. A magnetic resonance apparatus for reducing distortions in diffusion-weighted magnetic resonance images of an examination subject, comprising:

a magnetic resonance data acquisition unit;

a control unit that operates said magnetic resonance data acquisition unit to acquire magnetic resonance data in a first measurement with a first diffusion weighting;

said control unit also operating said magnetic resonance data acquisition unit to acquire magnetic resonance data in a second measurement with a second diffusion weighting that is different from said first diffusion weighting;

a computerized processor configured to automatically determine a non-linear, system-specific distortion-correcting function based on information that is specific to said magnetic resonance data acquisition system;

said computerized processor being configured to calculate correction parameters, by applying said system-specific distortion-correcting function to said magnetic resonance data acquired in said first and second measurements, to distortion-correcting subsequently-acquired diffusion-weighted magnetic resonance images; and said control unit operating said magnetic resonance data acquisition unit to acquire a diffusion-weighted magnetic resonance image of the examination subject that embodies distortions therein, and said computerized processor being configured to apply said correction parameters to said diffusion-weighted magnetic resonance image to correct said diffusion-weighted magnetic resonance image to at least reduce said distortions therein.

15. A magnetic resonance apparatus as claimed in claim 14 comprising a memory containing said system-specific information as data representing a system-specific geometry of field interferences respectively for different gradient axes of said magnetic resonance data acquisition unit.

\* \* \* \* \*